US006956793B2

(12) United States Patent (10) Patent No.: US 6,956,793 B2
Ngo (45) Date of Patent: Oct. 18, 2005

(54) PHASE CLOCK SELECTOR FOR GENERATING A NON-INTEGER FREQUENCY DIVISION

(75) Inventor: Hung C. Ngo, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 76 days.

(21) Appl. No.: 10/718,063

(22) Filed: Nov. 20, 2003

(65) Prior Publication Data

US 2005/0110581 A1 May 26, 2005

(51) Int. Cl.[7] .................... G04F 5/00; G04B 18/00; H03K 23/00; H03K 21/00; G06F 1/02
(52) U.S. Cl. ............... 368/156; 368/200; 327/117; 327/156; 377/48; 377/118; 708/103; 708/271
(58) Field of Search ................ 368/155, 156, 368/200–202; 327/115, 117, 147, 156; 377/47, 377/48, 118; 708/103, 271

(56) References Cited

U.S. PATENT DOCUMENTS

| 5,189,685 | A | * | 2/1993 | Jaffard et al. ............ 377/48 |
| 5,982,210 | A | * | 11/1999 | Rogers .................. 327/156 |
| 6,157,694 | A | | 12/2000 | Larsson .................. 377/48 |
| 6,441,655 | B1 | * | 8/2002 | Fallahi et al. ............ 327/115 |
| 6,501,304 | B1 | | 12/2002 | Boerstler et al. .......... 327/99 |
| 6,535,989 | B1 | * | 3/2003 | Dvorak et al. ........... 713/500 |
| 6,542,013 | B1 | * | 4/2003 | Volk et al. .............. 327/115 |
| 6,714,056 | B2 | * | 3/2004 | Fallahi et al. ............ 327/115 |
| 6,738,449 | B2 | * | 5/2004 | Dalt .................... 377/48 |
| 6,807,552 | B2 | * | 10/2004 | Bredin et al. ............ 708/103 |
| 6,845,490 | B2 | * | 1/2005 | Natsume ................ 716/1 |

* cited by examiner

Primary Examiner—Vit W. Miska
(74) Attorney, Agent, or Firm—Richard F. Frankeny; Winstead Sechrest & Minick P.C.; Casimer K. Salys

(57) ABSTRACT

A frequency divider circuit uses a base counter to frequency divide a clock signal with period T by an integer value N and employs a cyclic rotational select circuit to select among multiple equally phase shifted signals of a multiple phase clock to generate a fractional term P/k where P is variable from 0 to k−1. The counter counts an output clock that corresponds to the output of a multiplexer selecting from among the multiple clock phases. Depending on the desired fractional term, after N counts of the output clock phases of the multiple phase clock are selected glitch free by rotationally selecting a first phase, and skipping either 0, 1, 2 ... up to k−1 sequential phases to generate fractional terms 0, 1/k, 2/k, 3/k ... k−1/k, respectively, thus providing frequency division corresponding to N+P/k where P may be varied from 0 to k−1.

20 Claims, 11 Drawing Sheets

| Number of N cycles | $R_0$ | $R_1$ | $R_2$ | $R_3$ | P_SEL(0) | P_SEL(1) | P_SEL(2) | P_SEL(3) |
|---|---|---|---|---|---|---|---|---|
| 0 | $R_0$ | $R_1$ | $R_2$ | $R_3$ | 1 | 0 | 0 | 0 |
| 1 | $R_0$ | $R_1$ | $R_2$ | $R_3$ | 1 | 0 | 0 | 0 |
| 2 | $R_0$ | $R_1$ | $R_2$ | $R_3$ | 1 | 0 | 0 | 0 |
| ⋮ | $R_0$ | $R_1$ | $R_2$ | $R_3$ | 1 | 0 | 0 | 0 |
| n | $R_0$ | $R_1$ | $R_2$ | $R_3$ | 1 | 0 | 0 | 0 |

Decoder output 135 = D [1000]

FIG. 6A

| Number of N cycles | $R_0$ | $R_1$ | $R_2$ | $R_3$ | P_SEL(0) | P_SEL(1) | P_SEL(2) | P_SEL(3) |
|---|---|---|---|---|---|---|---|---|
| 0 | $R_0$ | $R_1$ | $R_2$ | $R_3$ | 1 | 0 | 0 | 0 |
| 1 | $R_3$ | $R_0$ | $R_1$ | $R_2$ | 0 | 1 | 0 | 0 |
| 2 | $R_2$ | $R_3$ | $R_0$ | $R_1$ | 0 | 0 | 1 | 0 |
| 3 | $R_1$ | $R_2$ | $R_3$ | $R_0$ | 0 | 0 | 0 | 1 |
| 4 | $R_0$ | $R_1$ | $R_2$ | $R_3$ | 1 | 0 | 0 | 0 |

Decoder output 135 = D [0100]

FIG. 6B

| Number of N cycles | $R_0$ | $R_1$ | $R_2$ | $R_3$ | P_SEL(0) | P_SEL(1) | P_SEL(2) | P_SEL(3) |
|---|---|---|---|---|---|---|---|---|
| 0 | $R_0$ | $R_1$ | $R_2$ | $R_3$ | 1 | 0 | 0 | 0 |
| 1 | $R_2$ | $R_3$ | $R_0$ | $R_1$ | 0 | 0 | 1 | 0 |
| 2 | $R_0$ | $R_1$ | $R_2$ | $R_3$ | 1 | 0 | 0 | 0 |
| 3 | $R_2$ | $R_3$ | $R_0$ | $R_1$ | 0 | 0 | 1 | 0 |
| 4 | $R_0$ | $R_1$ | $R_2$ | $R_3$ | 1 | 0 | 0 | 0 |

Decode [0010]

FIG. 6C

| Number of N cycles | $R_0$ | $R_1$ | $R_2$ | $R_3$ | P_SEL(0) | P_SEL(1) | P_SEL(2) | P_SEL(3) |
|---|---|---|---|---|---|---|---|---|
| 0 | $R_0$ | $R_1$ | $R_2$ | $R_3$ | 1 | 0 | 0 | 0 |
| 1 | $R_1$ | $R_2$ | $R_3$ | $R_0$ | 0 | 0 | 0 | 1 |
| 2 | $R_2$ | $R_3$ | $R_0$ | $R_1$ | 0 | 0 | 1 | 0 |
| 3 | $R_3$ | $R_0$ | $R_1$ | $R_2$ | 0 | 1 | 0 | 0 |
| 4 | $R_0$ | $R_1$ | $R_2$ | $R_3$ | 1 | 0 | 0 | 0 |

Decode [0001]

FIG. 6D

PHASE CLOCK SELECTOR FOR GENERATING A NON-INTEGER FREQUENCY DIVISION

TECHNICAL FIELD

The present invention relates in general to circuits for generating and controlling computer clocks and in particular to phase-locked loops for generating clocks using fractional division of a feedback clock.

BACKGROUND INFORMATION

Phase-locked loops (PLLs) have been widely used in high-speed communication systems because PLLs efficiently perform clock recovery or clock generation at a relatively low cost. Dynamic voltage and frequency scaling is a critical capability in reducing power consumption of power sensitive devices. Scaling, in this sense, means the ability to select high performance with nominal power supply voltages and high frequency clock operation or low performance by reducing the power supply voltage and corresponding the clock frequency. Reducing the system power is usually done when performance is not needed or when running from a limited energy source such as a battery. To allow low power operation, the PLL and other circuits must support very aggressive power/energy management techniques. For the PLL, this means low power operation while supporting key required features such as dynamic frequency scaling, dynamic voltage scaling, clock freezing and alternate low frequency clocking. Dynamic implies that the PLL is able to support changes in the output frequency and logic supply voltage without requiring the system to stop operation or waiting for the PLL clock to reacquire lock.

Using a PLL or delay-locked loop (DLL) has advantages in a battery powered system because a PLL is able to receive a lower frequency reference frequency from a stable oscillator to generate system clock frequencies. A PLL also allows changing the system clock frequency without changing the reference frequency.

In switching between two or more clocks in a PLL or other logic system, it is important that the switching be glitch-free. Transients that occur on a clock in a computer system that is not one of the useable edges may be mistaken by the logic system as a valid clock edge and thus create timing problems or system failures. If the two or more clocks are synchronous, which means they are derived from the same reference source, providing glitch-free switching is simpler to achieve. However, if the two or more clocks are not synchronous, glitch-free switching is more difficult. In many logic systems, and in particular PLL clock systems used in a system that employs frequency scaling, there are times when it may be advantageous to switch between asynchronous clocks for the system clock while providing glitch-free switching.

Multi-frequency clocks have been used to enable fractional frequency division. Typically, as shown in the prior art, a frequency synthesizer generates a number of evenly phased clocks that are selected in a multiplexer (MUX) controlled by state machine. The output clock of the MUX extends the last cycle of the count fractionally. The clock then goes through the integer frequency divider resulting in a fractionally divided clock. The prior art state machine is complex requiring two counters, a decoder, and another phase clock MUX. The prior art mentions that the transitions from phase 01 to phase 02 occurs after sensing that phase 01 goes from a logic one to a logic zero and after phase 02 to those from a logic one to a logic zero. However, there is no mechanism shown to perform the required phase switching. The prior art does not address the difficulties of transitioning from phases 01 to phase 04, sensing the transition of phase 01 from a logic one to a logic zero and then sensing the transition of phase 04 from a logic zero to a logic one and then from a logic one to a logic zero.

There is, therefore, a need for a circuit that allows fractional frequency division of a clock by selectively switching glitch free between phases of clock defining the resolution of fractional division.

SUMMARY OF THE INVENTION

A circuit and method of dividing a multiphase clock having a period T and k clock phases by an integer N generating a frequency divided clock (FDC) such that the period of the FDC is $(N \times T)+(T \times (P/k))$ where the value of P is variable from 1 to k−1 and the frequency of the FDC is a non-integer fraction of the multiphase clock. A glitch free clock selector selects between the k clock phases to generate a clock output signal. The clock output signal is used to clock a synchronous counter that produces a shift clock signal after N cycles of the clock signal. A select signal is decoded to determine what fraction P/k is desired for the fractional division of the clock. A rotate circuit generates "one hot" select signals; one for each of the K clock phases. If a select signal for a particular phase is a logic one, the corresponding phase is selected as the clock output signal to be counted for the next N clock cycles. The k select signals are employed in a feedback circuit such that after each N clock cycles the clock phases are selected by rotating through the phases depending on the fraction desired. If the desired period of the divided clock is $(N \times T + T \times (P/k))$, then after N cycles of the clock output signal, an index defining the selected phase for the clock output signal is incremented by P.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIGS. 6A–6D has tables for signal states for the four decodes of the select signals determining a desired fractional clock division for a four phase clock;

DETAILED DESCRIPTION

Figure 1:
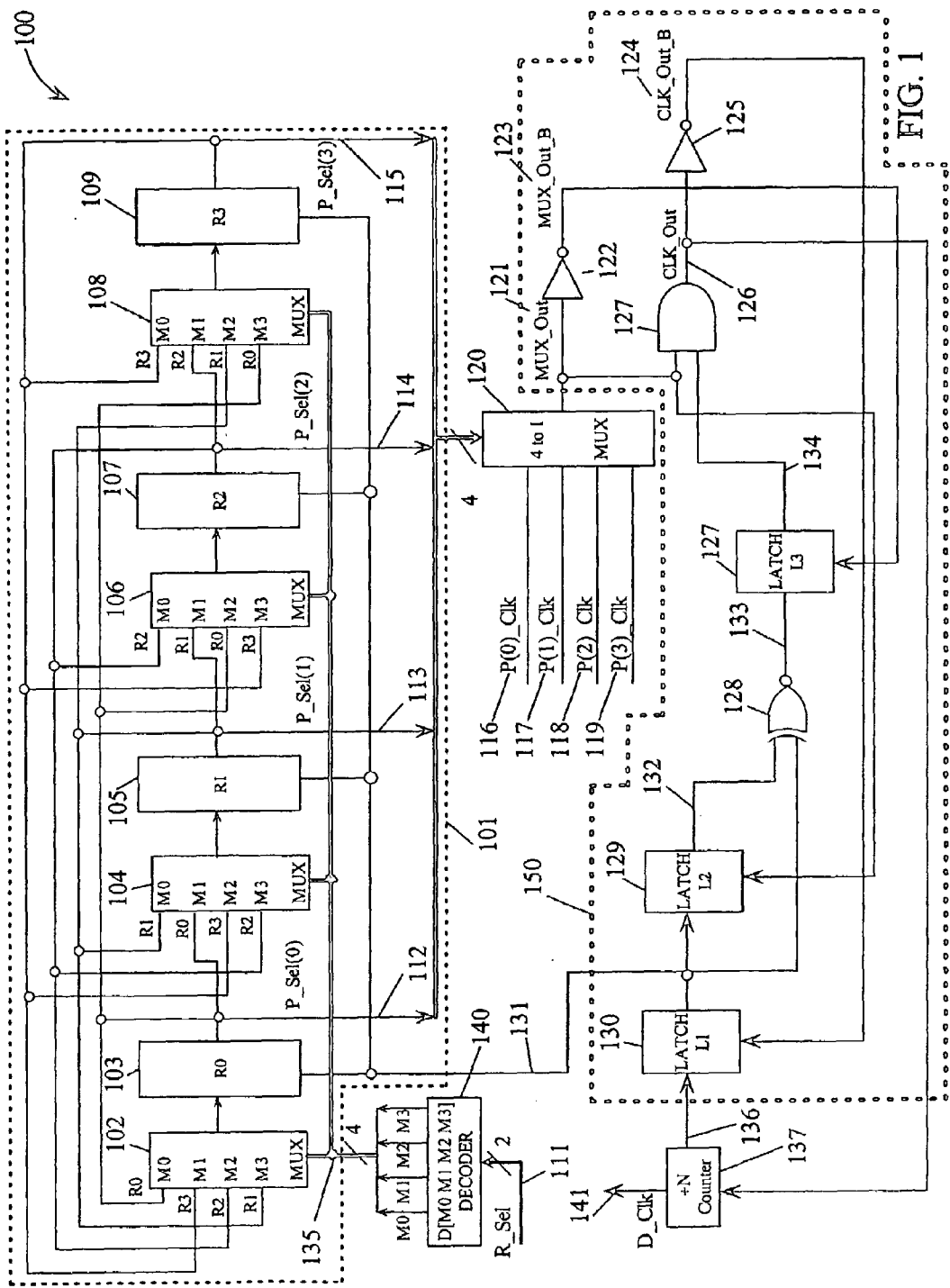
FIG. 1 is a circuit diagram of a fractional divider circuit according to embodiments of the present invention using four clock phases, P0__Clk, P1__Clk, P2__Clk and P3__Clk.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, data formats within communication protocols, and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 1 is a non-integer fractional frequency divider (FFD) 100 according to embodiments of the present invention. FFD 100 comprises glitch free selection circuitry 150 for selecting among multiple clock phases and a rotary selector 101. FFD 100 is an exemplary unit that receives four equally spaced clock signal phases, P(0)_Clk 116, P(1)_Clk 117, P(2)_Clk 118 and P(3)_Clk 119. These four phases are inputs to a 4 to 1 multiplexer that selects one of the four phases as MUX_Out 121 in response to four "one hot" select signals, P_Sel(0) 112, P_Sel(1) 113, P_Sel(2) 114 and P_Sel(3) 115. "One hot" means that only one of the four signals is a logic one at any one time period. MUX_Out 121 is inverted by inverter 122 to generate MUX_Out_B 123. MUX_Out 121 is coupled to logic AND gate 127 which generates Clk_Out 126 gated by No Hold 134. Clk_Out 126 is inverted by inverter 125 generating Clk_Out_B 124. Counter 137 counts positive transitions of the clock phase P(0)_Clk 116-P(3)_Clk 119 selected by MUX 120 as Clk_Out 126. The output 136 of counter 137 transitions to a logic one on the Nth transition of Clk_Out 126 from a logic zero to a logic one. The state of output 136 is latched into latch L1 130 when Clk_Out_B 124 transitions from a logic zero to a logic one generating Shift 131. A logic one on Shift 131 signals rotate circuitry 101 to generate new states for select signals P_Sel(0) 112, P_Sel(1) 113, P_Sel (2) 114 and P_Sel(3) 115 in response to the value of R_Sel 111. Shift 131 remains a logic zero for N-1 cycles of Clk_Out 126, therefore prior to the Nth cycle of Clk_Out 126 Shift 131 is a logic zero. The logic zero of Shift 131 would have been latched into latch L2 129 generating output 132. Since Shift 131 remains at a logic zero for N-1 cycles of Clk_Out 126, Shift 131 and output 132 are at a logic zero prior to the Nth cycle of Clk_Out 126. The output 133 of exclusive NOR logic gate 128 is a logic one if both Shift 131 and output 132 have the same logic state and is a logic zero if they differ. Since they have the same logic value prior to the Nth cycle of Clk_Out 126, output 133 is a logic one. The logic one of output 133 is latched into latch L3 127 generating a logic one at No Hold 134 which enables logic AND gate 127 and MUX_Out 121 is outputted as Clk_Out 126. In this manner, a particular phase is selected as Clk_Out 126 which in turn is counted by Counter 137 to generate output 136 and thereby Shift 131.

When the Nth transition of the present phase generating Clk_Out 126 occurs, MUX_Out 121 and Clk_Out_B 124 are the complementary signals of the same phase. The present state of Shift 131 (logic zero) is latched into L2 129 on the Nth transition of MUX_Out 121. At this point there has been no change in Shift 131, therefore No Hold 134 remains a logic one. However, on the transition from a logic one to a logic zero following the Nth transition of Clk_Out 126, Clk_Out_B 124 transitions to a logic one latching the logic one on output 136 into latch L1 130 changing Shift 131 from a logic zero to a logic one. Now the output 133 of XNOR 128 is a logic zero. The logic zero on output 133 is latched into L3 127 on the transition of MUX_Out_B 123 from a logic zero to a logic one following this state change on output 133.

When Shift 131 transitioned to a logic one, it signals registers R0 103, R1 105, R2 107 and R3 109 to load in the output of their corresponding MUX 102, 104, 106, and 108, respectively. Each of the MUXs 102, 104, 106, and 108 are four to one MUXs that receive decoded select signals M0–M3. Select signals M0–M3 are again "one hot" signals in that only one of the four inputs is a logic one during any time interval. The output of decoder 140 is represented as D[M0 M1 M2 M3]. Since FFD 100 is a four phase circuit the four possible outputs are D[1000], D[0100], D[0010] and D[0001]. If the output is D[1000], then R0 (P_Sel (0)) is selected as the output of MUX 102 to be loaded into R0 103. When D[1000] is the output of decoder 140, there is not cyclic change in the logic states of P_Sel(0) 112, P_Sel(1) 113, P_Sel(2) 114 and P_Sel(3) 115. If registers R0 103, R1 105, R2 107 and R3 109 were initially loaded with logic values of [1000] respectively, then phase P(0)_Clk 116 is selected as MUX_Out 121 and this selection does not change. When the output of decoder 140 is D[1000], there is no fractional division.

When the output of decoder 140 has any of the other value, the action of rotate circuitry 101 is different. For example, if the output of decoder 140 is D[0100], then input M1 of MUXs 102, 104, 106, and 108 are loaded into registers R0 103, R1 105, R2 107 and R3 109, respectively when Shift 131 is a logic one. In this case, the state of P_Sel (3) 115 is loaded into R0 103, P_Sel (0) 112 is loaded into R1 105, P_Sel (1) 113 is loaded into R2 107, and P_Sel (2) 114 is loaded into R3 109. If the initial state of the select signals was [1000], then the states "rotate" to [0100] when Shift 131 transitions to a logic one following the Nth transition on Clk_Out 126. Before any change can occur in the output 132 of latch L2 129, MUX_Out 120 switches from P(0)_Clk 116 to P(1)_Clk 117 on the transition of the present Clk_Out_B 124 from a logic zero to a logic one which occurs one half cycle after the Nth transition of Clk_Out 126. In this case, MUX_Out 121 will transition to a logic zero, following P(0)_Clk 116, for a short duration. Likewise, MUX_Out 123 will transition to a logic one and clock latch L3 127 loading the logic zero of output 133. Output 134 then transitions to a logic zero degating AND gate 127 while MUX_Out 121 is a logic zero holding Clk_Out 126 at a logic zero during the transition from P(0)_Clk 116 to P(1)_Clk 117. Since P(0)_Clk 116 and P(1)_Clk 117 are 90° out of phase, MUX_Out 121 will transition back to a logic one as the MUX 120 completes the switch from P(0)_Clk 116 to P(1)_Clk 117. This positive transition on MUX_Out 121 will clock latch L2 129 and output 133 will go back to a logic one, however this logic one will not be clocked into latch L3 127 until MUX_Out_B 123 transitions to a logic one again. Since MUX_Out 121 and MUX_Out_B 123 are now following P(1)_Clk 117, MUX_Out_B 123 transitions to a logic one when MUX_Out 121 is transitioning to a logic zero. By the time output 134 transitions back to a logic one enabling AND gate 127, MUX_Out 121 has the same logic zero state as Clk_Out 126 had when AND gate 127 was degated by No Hold signal 134. This assures that the switching from P(0)_Clk 116 to P(1)_Clk 117 is glitch free. Counter 137 will now count logic one transitions of P(1)_Clk 117 starting with the first full cycle of P(1)_Clk 117 following the Nth transition of P(0)_Clk 116.

Counter 137 is a synchronous counter that uses Clk_Out 126 as its clock signal. Clk_Out 126 follows one of the four clock phases: P(0)_Clk 116, P(1)_Clk 117, P(2)_Clk 118 or P(3)_Clk 119, which all have a period of T. The Nth cycle of Clk_Out 126 is extended by an amount determined by the binary value of R_Sel 111. Counter 137 produces a divided clock signal (D_Clk) 141 that has a period equal to (N×T+Pd×T/4) where Pd is 0, 1, 2 or 3 depending on the desired fractional division. Therefore, D_Clk 141 has a period that is a first logic level for a time (N/2×T) and a second logic level for a time (N/2×T+Pd×T/4); the period of D_Clk 141 is not symmetrical. The particular implementation of Counter 137 determines whether the first logic level is a logic one or a logic zero.

Figure 2:
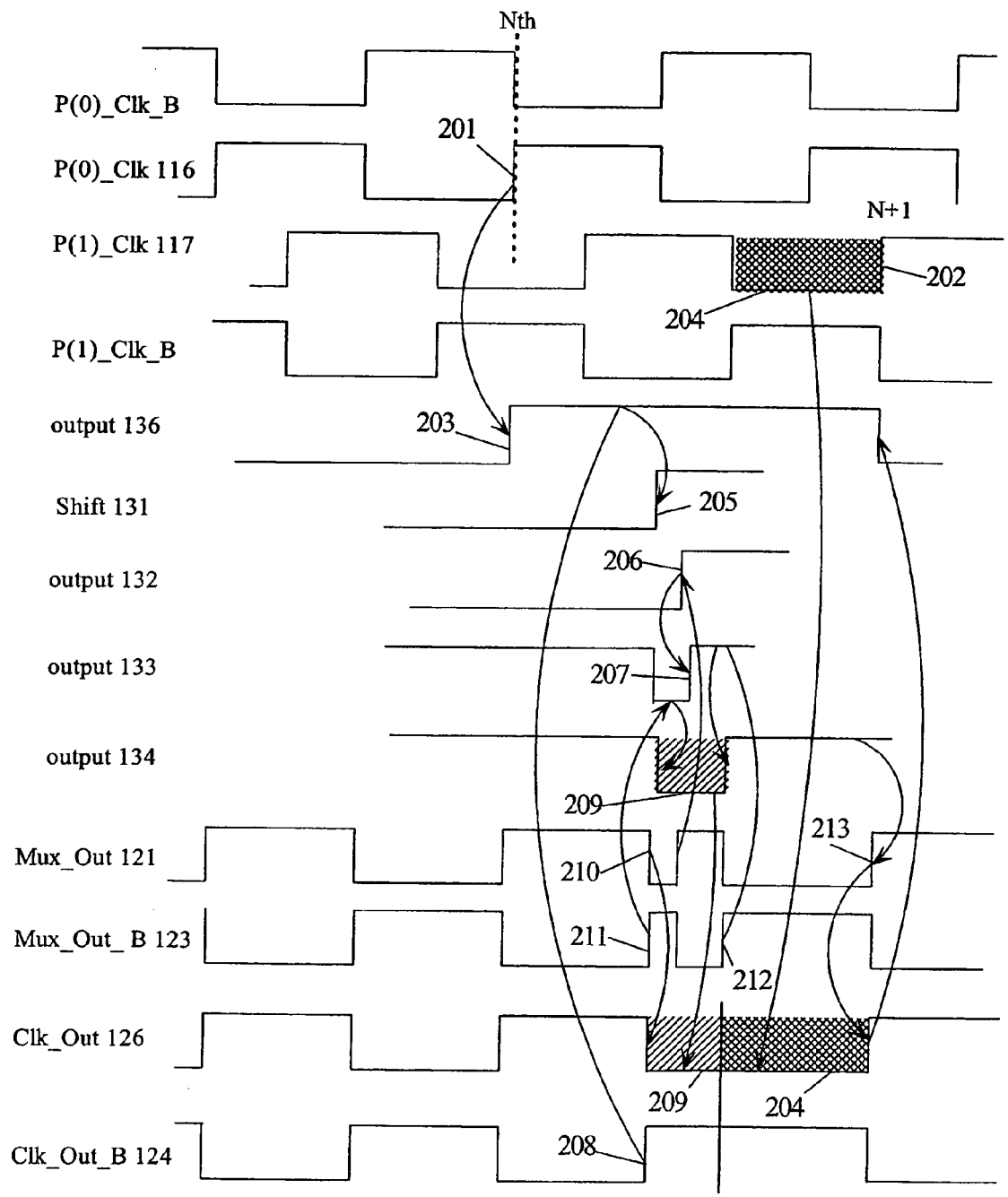
FIG. 2 is a timing diagram of signals in the circuit of FIG. 1 when switching between the P0__Clk and P1__Clk.

FIG. 2 is a timing diagram of signals in FFD 100 when switching from phase P(0)_Clk 116 to P(1)_Clk 117. Counter 137 (FIG. 1) is presumed to be counting P(0)_Clk 116 as Clk_Out 126. P(0)_Clk_B is shown as the inversion of P(0)_Clk 116 and occurs at MUX_Out_B 123 whenever P(0)_Clk 116 is selected by MUX 120. On the Nth positive transition 201 of P(0)_Clk 116, counter 137 generates the positive transition 203 of output 136. The positive transition 208 of Clk_Out_B 124 latches output 136 in latch L1 130 generating positive transition 205 of Shift 131. At this time, Shift 131 and output 132 have different logic values; therefore, the output 133 of XNOR logic gate 128 is a logic zero. The combination of output 133 at a logic zero and positive transition 211 of MUX_Out_B 123 latches the logic zero of output 133 into latch L3 127 and output 134 goes to a logic zero. This is shown as time period 209 on output 134. During the time 209, output 134 degates AND logic gate 127. At this time, Clk_Out 126 is following P(0)_Clk 116 until Shift 131 transitions to a logic one. The positive transition of Shift 131 occurs when Clk_Out_B 124 transitions to a logic one which is slightly delayed from when Clk_Out 126 transitions to a logic zero. Therefore, output 134 degates AND gate 127 at the time Clk_Out 126 is at a logic zero. Output 134 keeps Clk_Out 126 at a logic zero for the time period 209. Transition 210 of MUX_Out 121 occurs because it is following P(0)_Clk 116. Coincident positive transition 205 of Shift 131 selects a new phase (P(1)_Clk 117) via rotate circuit 101. Therefore, a short time after transition 210, MUX_Out 121 which is now following P(1)_Clk 117, transitions back to a logic one. The positive transition on MUX_Out 121 clocks latch L2 129. Output 132 and Shift 131 now have the same logic value and output 133 transitions (207) back to a logic one. MUX_Out_B 123 transitions (212) to a logic one on the first negative transition of P(1)_Clk 117 after transition 203 of Shift 131 clocking latch L3 127. Output 134 transitions to a logic one enabling AND logic gate 127. However, AND logic gate 127 is enabled when MUX_Out 121 (now following P(1)_Clk 117) is a logic zero. Therefore, Clk_Out 126 remains at a logic zero for the period 204 when P(1)_Clk 117 is a logic zero. The next positive transition of Clk_Out 126 occurs on the positive transition 213 of MUX_Out 121 following the first full cycle of P(1)_Clk 117 after the Nth transition 201 of P(0)_Clk 116. This assures glitch free switching between P(0)_Clk 116 and P(1)_Clk 117 and the extension of the Nth cycle of Clk_Out 126 by the phase difference between P(0) Clk 116 and P(1) Clk 117; in this case, the phase difference is T/4.

Figure 3:
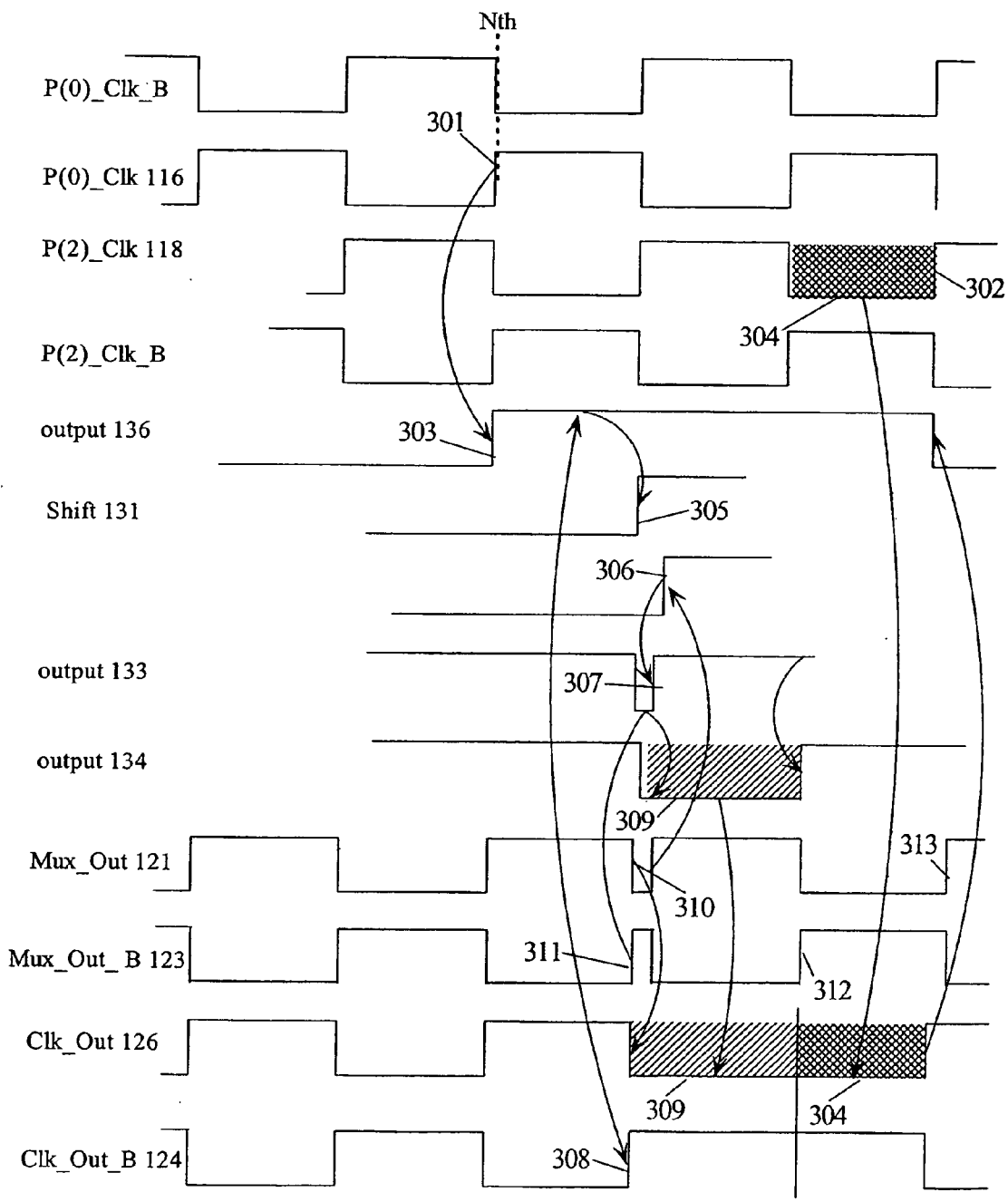
FIG. 3 is a timing diagram of signals in the circuit of FIG. 1 when switching between the P0__Clk and P2__Clk.

FIG. 3 is a timing diagram of signals in FFD 100 when switching from phase P(0)_Clk 116 to P(2)_Clk 118. Counter 137 (FIG. 1) is presumed to be counting P(0) Clk 116 as Clk_Out 126. On the Nth positive transition 301 of P(0) Clk 116, counter 137 generates the positive transition 303 of output 136. The positive transition 308 of Clk_Out_B 124 latches output 136 in latch L1 130 generating positive transition 305 of Shift 131. At this time, Shift 131 and output 132 have different logic values; therefore, the output 133 of XNOR logic gate 128 is a logic zero. The combination of output 133 at a logic zero and positive transition 311 of MUX_Out_B 123 latches the logic zero of output 133 into latch L3 127 and output 134 goes to a logic zero. This is shown as time period 309 on output 134. During the time 309, output 134 degates AND logic gate 127. At this time, Clk_Out 126 is following P(0)_Clk 116 until Shift 131 transitions to a logic one. The positive transition of Shift 131 occurs when Clk_Out_B 124 transitions to a logic one which is slightly delayed from when Clk_Out 126 transitions to a logic zero. Therefore, output 134 degates AND gate 127 at the time Clk_Out 126 is at a logic zero. Output 134 keeps Clk_Out 126 at a logic zero for the time period 309. Transition 310 of MUX_Out 121 occurs because it is following P(0)_Clk 116. Coincident positive transition 305 of Shift 131 selects a new phase (P(2)_Clk 118) via rotate circuit 101. Therefore, a short time after transition 310, MUX_Out 121 which is now following P(2)_Clk 118, transitions back to a logic one. The positive transition on MUX_Out 121 clocks latch L2 129. Output 132 and Shift 131 now have the same logic value and output 133 transitions (307) back to a logic one. MUX_Out_B 123 transitions (312) to a logic one on the first negative transition of P(2)_Clk 118 after transition 303 of Shift 131 clocking latch L3 127. Output 134 transitions to a logic one enabling AND logic gate 127. However, AND logic gate 127 is enabled when MUX_Out 121 (now following P(2)_Clk 118) is a logic zero. Therefore, Clk_Out 126 remains at a logic zero for the period 304 when P(2)_Clk 118 is a logic zero. The next positive transition of Clk_Out 126 occurs on the positive transition 313 of MUX_Out 121 following the first full cycle of P(2)_Clk 118 after the Nth transition 301 of P(0)_Clk 116. This assures glitch free switching between P(0)_Clk 116 and P(2)_Clk 118 and the extension of the Nth cycle of Clk_Out 126 by the phase difference between P(0)_Clk 116 and P(2)_Clk 118; in this case, the phase difference is T/2.

Figure 4:
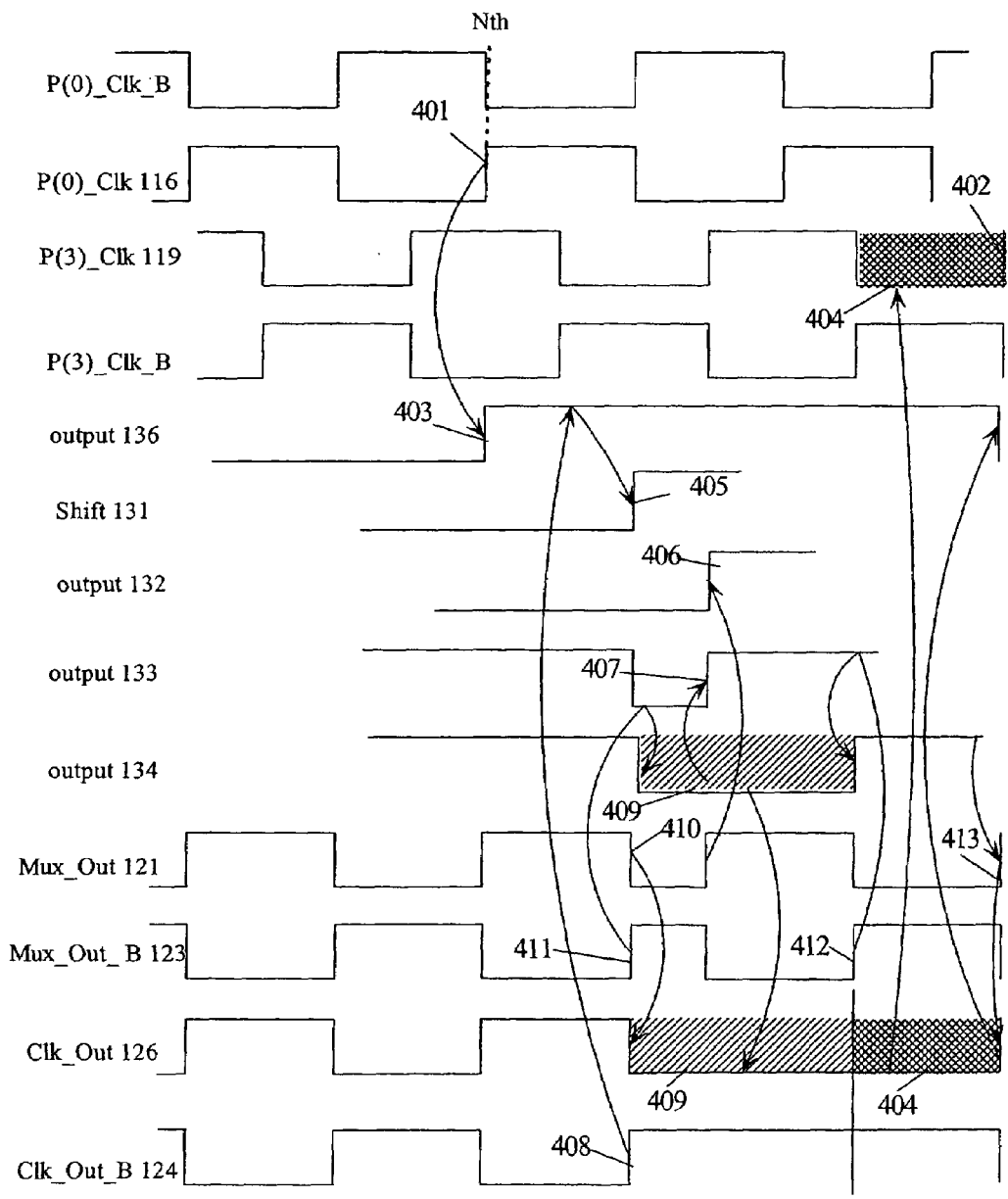
FIG. 4 is a timing diagram of signals in the circuit of FIG. 1 when switching between the P0__Clk and P3__Clk.

FIG. 4 is a timing diagram of signals in FFD 100 when switching from phase P(0)_Clk 116 to P(3)_Clk 119. Counter 137 (FIG. 1) is presumed to be counting P(0)_Clk 116 as Clk_Out 126. On the Nth positive transition 401 of P(0)_Clk 116, counter 137 generates the positive transition 403 of output 136. The positive transition 408 of Clk_Out_B 124 latches output 136 in latch L1 130 generating positive transition 405 of Shift 131. At this time, Shift 131 and output 132 have different logic values; therefore, the output 133 of XNOR logic gate 128 is a logic zero. The combination of output 133 at a logic zero and positive transition 411 of MUX_Out_B 123 latches the logic zero of output 133 into latch L3 127 and output 134 goes to a logic zero. This is shown as time period 409 on output 134. During the time 409, output 134 degates AND logic gate 127. At this time, Clk_Out 126 is following P(0)_Clk 116 until Shift 131 transitions to a logic one. The positive transition of Shift 131 occurs when Clk_Out_B 124 transitions to a logic one which is slightly delayed from when Clk_Out 126 transitions to a logic zero. Therefore, output 134 degates AND gate 127 at the time Clk_Out 126 is at a logic zero. Output 134 keeps Clk_Out 126 at a logic zero for the time period 409. Transition 410 of MUX_Out 121 occurs because it is following P(0)_Clk 116. Coincident positive transition 405 of Shift 131 selects a new phase (P(3)_Clk 119) via rotate circuit 101. Therefore a short time after transition 410, MUX_Out 121 which is now following P(3)_Clk 119, transitions back to a logic one. The positive transition on MUX_Out 121 clocks latch L2 129. Output 132 and Shift 131 now have the same logic value and output 133 transitions (407) back to a logic one. MUX_Out_B 123 transitions (412) to a logic one on the first negative transition of P(3)_Clk 119 after transition 403 of Shift 131 clocking latch L3 127. Output 134 transitions to a logic one enabling AND logic gate 127. However, AND logic gate 127 is enabled when MUX_Out 121 (now following P(3)_Clk 119) is a logic zero. Therefore, Clk_Out 126 remains at a logic zero for the period 404 when P(3)_Clk 119 is a logic zero. The next positive transition of Clk_Out 126 occurs on the positive transition 413 of MUX_Out 121 following the first full cycle of P(3)_Clk 119 after the Nth transition 401 of P(0)_Clk 116. This assures glitch free switching between P(0)_Clk 116 and P(3)_Clk 119 and the extension of the Nth cycle of Clk_Out 126 by the phase difference between P(0)_Clk 116 and P(3)_Clk 119; in this case, the phase difference is 3T/4.

Figure 5:
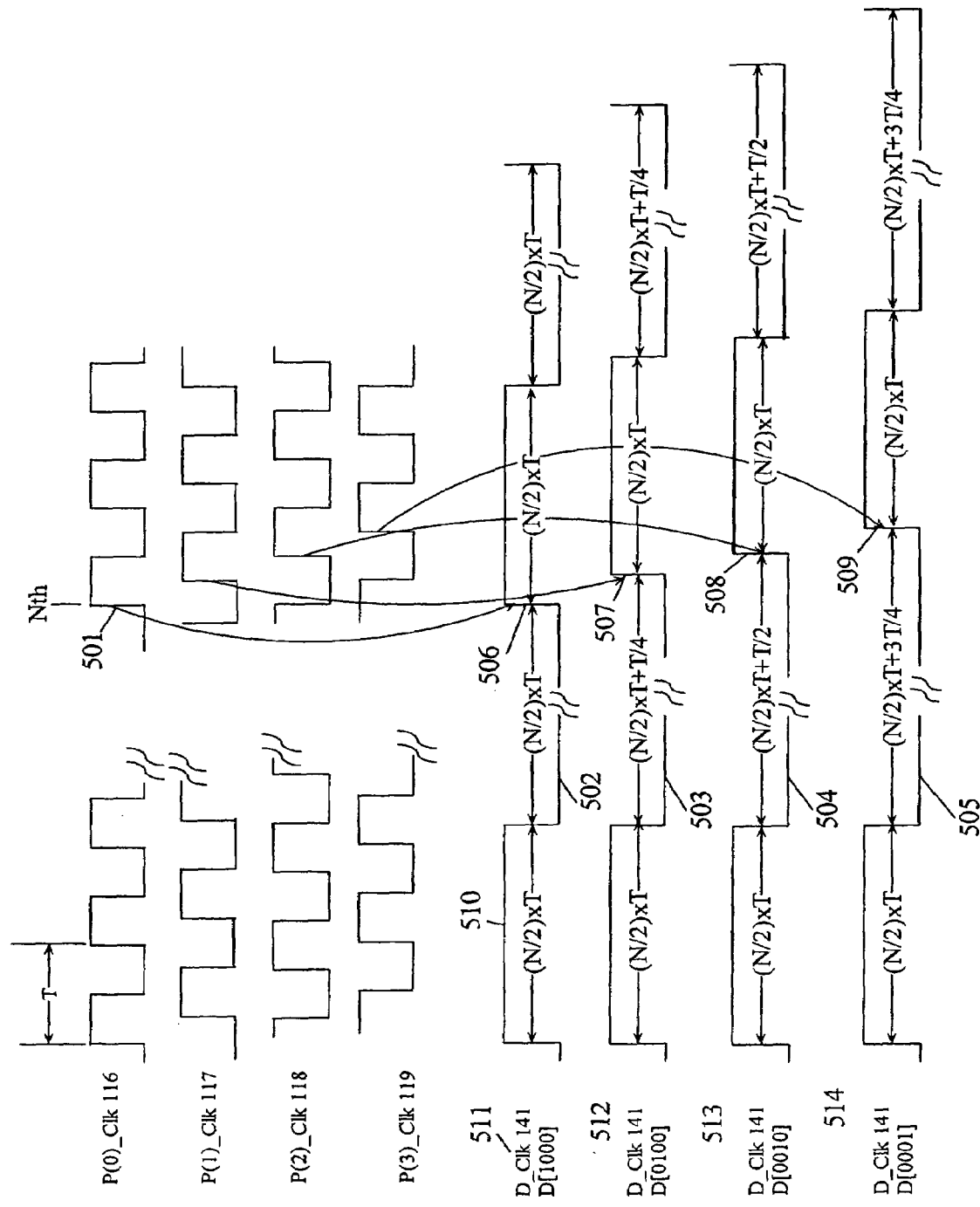
FIG. 5 is a timing diagram of signals in the circuit of FIG. 1 illustrating the period of the divided clock depending on the selected fractional division.

FIG. 5 is a timing diagram illustrating D_Clk 141 as the result of switching from P(0)_Clk 116 to P(1)_Clk 117, P(2)_Clk 118, and P(3)_Clk 119. The period of P(0)_Clk 116 is equal to T. After the Nth transition 501 of P(0)_Clk 116, one of the four waveforms for D_Clk 141 are generated. If the decode 135 is equal to D[1000], then no fractional division is selected and Clk_Out 126 will always follow P(0)_Clk 116 and waveform 511 for D_Clk 141 will be generated. A cycle of waveform 511 comprises a time period 510 equal to (N/2)×T where 511 is a logic one and an equal time period 502 where 511 is a logic zero. Positive transition 506 of waveform 511 coincides with the Nth transition of P(0)_Clk 116.

If the decode 135 is equal to D[0100], then a fractional division of (N+¼) is selected and Clk_Out 126 will follow P(0)_Clk 116 until the Nth transition when it will switch to P(1)_Clk 117 by rotate circuit 101 and waveform 512 for D_Clk 141 will be generated. A cycle of waveform 512 comprises a time period 510 equal to (N/2)×T where 512 is a logic one and an unequal time period 503 equal to (N/2)×T+T/4 where 512 is a logic zero. Time period 503 is extended as positive transition 507 of waveform 512 is shifted by T/4 from the Nth transition of P(0)_Clk 116. When fractional division is selected, the resulting D_Clk 141 has an asymmetrical period.

If the decode 135 is equal to D[0010], then a fractional division of (N+½) is selected and Clk_Out 126 will follow P(0)_Clk 116 until the Nth transition when it will switch to P(2)_Clk 118 by rotate circuit 101 and waveform 513 for D_Clk 141 will be generated. A cycle of waveform 513 comprises a time period 510 equal to (N/2)×T where 513 is a logic one and an unequal time period 504 equal to (N/2)×T+ T/2 where 513 is a logic zero. Time period 504 is extended as positive transition 508 of waveform 513 is shifted by T/2 from the Nth transition of P(0)_Clk 116.

Finally, if the decode 135 is equal to D[0001], then a fractional division of (N+¾) is selected and Clk_Out 126 will follow P(0)_Clk 116 until the Nth transition when it will switch to P(3)_Clk 119 by rotate circuit 101 and waveform 514 for D_Clk 141 will be generated. A cycle of waveform 514 comprises a time period 510 equal to (N/2)×T where 514 is a logic one and an unequal time period 505 equal to (N/2)×T+¾ where 515 is a logic zero. Time period 505 is extended as positive transition 509 of waveform 514 is shifted by 3T/4 from the Nth transition of P(0)_Clk 116.

FIGS. 6A–6D illustrate states of signals in rotate circuit 101 in response to positive transition on Shift 131 and the states D[M0 M1 M2 M3] on decoder output 135. R0 602, R1 603, R2 603, and R3 604 are the source of values loaded into registers R0 103, R1 105, R2 107 and R3 109, respectively, after N cycles of Clk_Out 126 are counted in counter 137. Column 601 indicates sequential numbers of N cycles counted by counter 137. P_Sel(0) 112, P_Sel(1) 113, P_Sel(2) 113, and P_Sel(3) 114 are the cyclic values used to select phases in MUX 120 for MUX_Out 121.

FIG. 6A illustrates the case when decoder output 135 has the value D[1000]. The value of feedback R0 (P_Sel(0) 112) is loaded into register R0 103. Whatever is the initial value of P_Sel(0) 112, it is reloaded back into R0 103 every time the count of N is reached in counter 137 and Shift 131 transitions to a logic one. The same is true for each of the remaining registers R1 603, R2 603, and R3 604, their initial value is loaded back as the new value after the count of N is reached in counter 137 and Shift 131 transitions to a logic one. This is the trivial case where no fractional division is selected and Clk_Out 126 is divided by the integer N.

FIG. 6B illustrates the case when decoder output 135 has the value D[0100]. After the first N cycles are counted, the output of register R3 109 is loaded into R0 103, the output of register R0 103 is loaded into R1 105, the output of register R1 105 is loaded into R2 107, and the output of register R2 107 is loaded into R3 109. Therefore, select signals P_Sel(0) 112, P_Sel(1) 113, P_Sel(2) 113, and P_Sel(3) 114 are likewise rotated. The progression or rotation continues as illustrated by the first five cycles of N counts as long as decoder output 135 remains D[0 100]. Since each phase is shifted from the next sequential phase by T/4, rotating in this fashion insures that after each N counts of Clk_Out 126 the Nth cycle of Clk_Out 126 will be extended by T/4. Without this cyclic rotation, the Nth cycle of Clk_Out 126 would only be extended once as each phase is indistinguishable from the other save their relative phase shifts.

FIG. 6C illustrates the case when decoder output 135 has the value D[0010]. After the first N cycles are counted, the output of register R2 105 is loaded into R0 103, the output of register R3 109 is loaded into R1 105, the output of register R0 103 is loaded into R2 107, and the output of register R1 105 is loaded into R3 109. Therefore select signals P_Sel(0) 112, P_Sel(1) 113, P_Sel(2) 113, and P_Sel(3) 114 are likewise rotated. The progression or rotation continues as illustrated by the first five cycles of N counts as long as decoder output 135 remains D[00 10]. After each N counts of Clk_Out 126, the rotate circuit skips a phase and switches back and forth from P(0)_Clk 116 to P(2)_Clk 118 and then from P(2)_Clk 118 back to P(0)_Clk 116. Since each phase is shifted from the next sequential phase by T/4, rotating in this fashion insures that after each N counts of Clk_Out 126 the Nth cycle of Clk_Out 126 will be extended by T/2.

Lastly, FIG. 6D illustrates the case when decoder output 135 has the value D[0001]. After the first N cycles are counted, the output of register R1 105 is loaded into R0 103, the output of register R2 107 is loaded into R1 105, the output of register R3 109 is loaded into R2 107, and the output of register R0 103 is loaded into R3 109. Therefore, select signals P_Sel(0) 112, P_Sel(1) 113, P_Sel(2) 113, and P_Sel(3) 114 are likewise rotated. The progression or rotation continues as illustrated by the first five cycles of N counts as long as decoder output 135 remains D[0001]. After each N counts of Clk_Out 126, the rotate circuit skips two phases and switches P(0)_Clk 116 to P(3)_Clk 119 and then from P(3)_Clk 119 to P(2)_Clk 118, etc. In this case, phases are selected essentially in a backward rotation. Since each phase is shifted from the next sequential phase by T/4, rotating in this fashion insures that after each N counts of Clk_Out 126 the Nth cycle of Clk_Out 126 will be extended by 3T/4.

Figure 7:
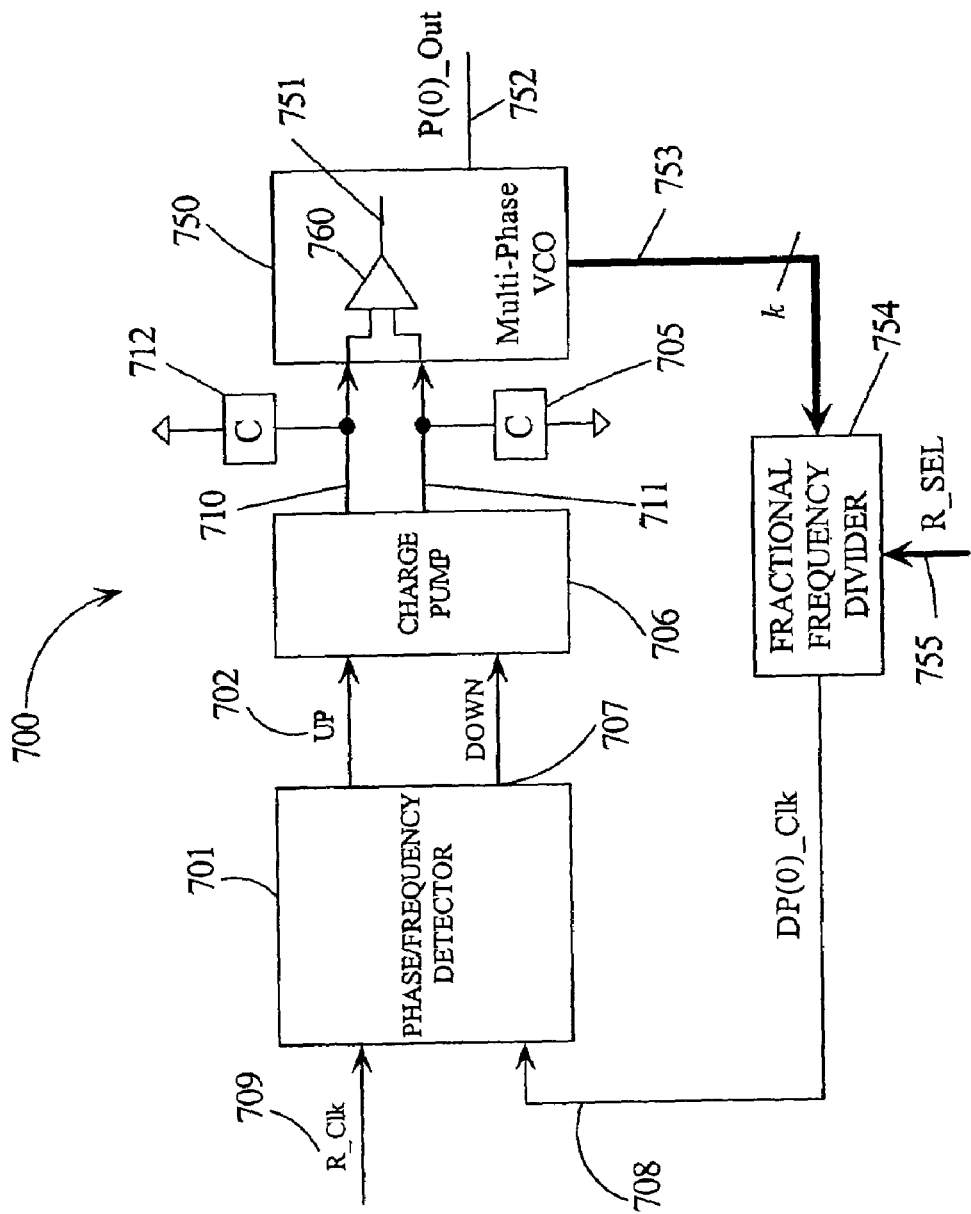
FIG. 7 is a circuit diagram of a fractional divider circuit according to embodiments of the present invention used with a multi-phase voltage controlled oscillator in a phase lock loop to generate clock with a fractional multiplier.

FIG. 7 is a functional block diagram of a representative phase lock loop (PLL) 700 suitable for practicing the principles of the present invention. FFD 754 operates according to embodiments of the present invention detailed relative to FIG. 1. FFD 754 receives k multi-phase clock signals 753 from multi-phase voltage controlled oscillator (VCO) 750. VCO 750 generates a P(0)_Out 752 with period T. Clock signals 753 comprise P(0)_Out 752 and (k−1) additional phases with relative phase shifts equal to T/k. FFD 754 receives select signals R_Sel 755 which determine the fractional amount P/k in addition to integer divisor N used to frequency divide P(0)_Out 752. Therefore the period of divided clock DP(0)_Clk 708 is equal to T/(N+P/k). DP(0)_Clk 708 is compared to reference clock R_Clk 709 in phase/frequency detector (PFD) 701. PFD 701 generates signals UP 702 and DOWN 707 that are integrated by charge pump circuit 706 to generate differential analog signals on capacitors 705 and 712. These differential signals may be used as is or converted to a single ended signal 751 by amplifier 760. This error signal is the control signal that varies the frequency of P(0)_Out 752. When R_Clk 709 and DP(0)_Clk 708 are phase and frequency locked, the error signal is minimized and the VCO 750 will be at steady state. Those skilled in the art will understand that details of PLL 700 outside of FFD 754 may have been omitted to simplify explanation of embodiments of the present invention.

It is assumed that VCO 750 has the range and response to lock at a frequency of its output corresponding to (N+P/k) times the frequency of R_Clk 709. When steady state is achieved, the frequency of P(0)_Out 752 is a non-integer multiple of the frequency R_Clk 709. By changing R_Sel 755, the frequency of P(0)_Out 752 may be modified with a non-integer multiplier.

Figure 9:
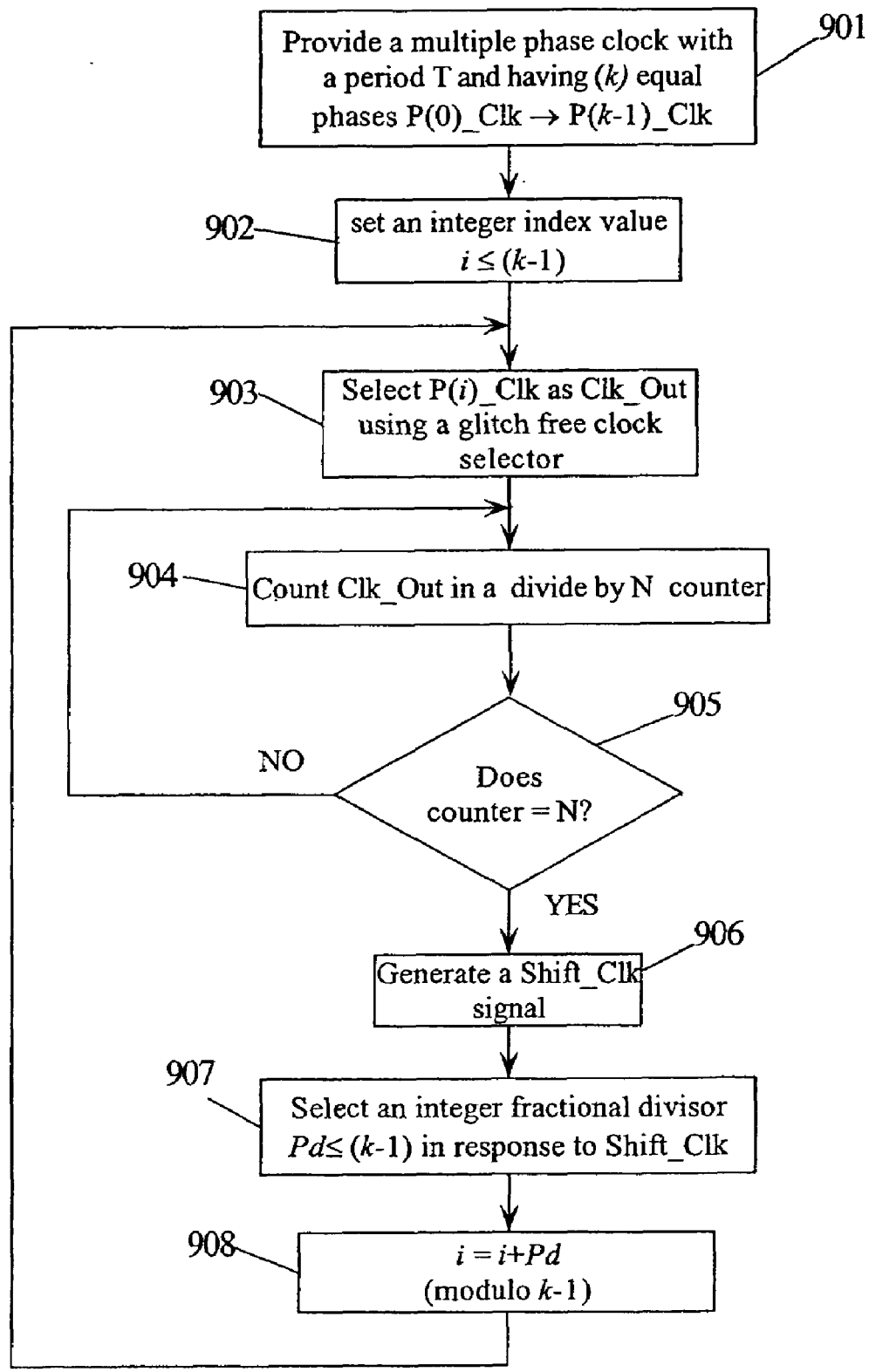
FIG. 9 is a method of generating a fractionally divided clock according to embodiments of the present invention.

FIG. 9 is a flow diagram of method steps used in embodiments of the present invention. In step 901, a multiple phase clock is provided with a period T having k equally phase shifted phases P(0)_Clk, P(1)_Clk, . . . P(k-1)_Clk. An integer index i<(k−1) outputted step 902. In step 903, a phase P(i)_Clk is selected as Clk_Out by glitch free selection of P(i)_Clk from the k clock phases P(0)_Clk . . . P(k-1)_Clk. In step 904, Clk_Out is counted in a divide by N counter. In step 905, a test is done to determine if the count of N has been reached. If the result of the test in step 905 is NO, then counting continues in step 904. If the result of the test in step 905 is YES, then in step 906 a Shift_Clk signal is generated by a transition to a logic state. In step 907 an integer fractional divisor Pd≦(k-1) is selected in response to the Shift_Clk signal. In step 908, a new index i is incremented by adding the value of Pd to the present value of i using modulo (k-1) addition in response to the transition of the Shift_Clk. Modulo (k-1) means that i=k is the same as i=0. A branch is then taken back to step 903 where a new phase P(i)_Clk is selected as Clk_Out by glitch free selection of P(i)_Clk from the k clock phases P(0)_Clk . . . P(k-1)_Clk.

Figure 10:
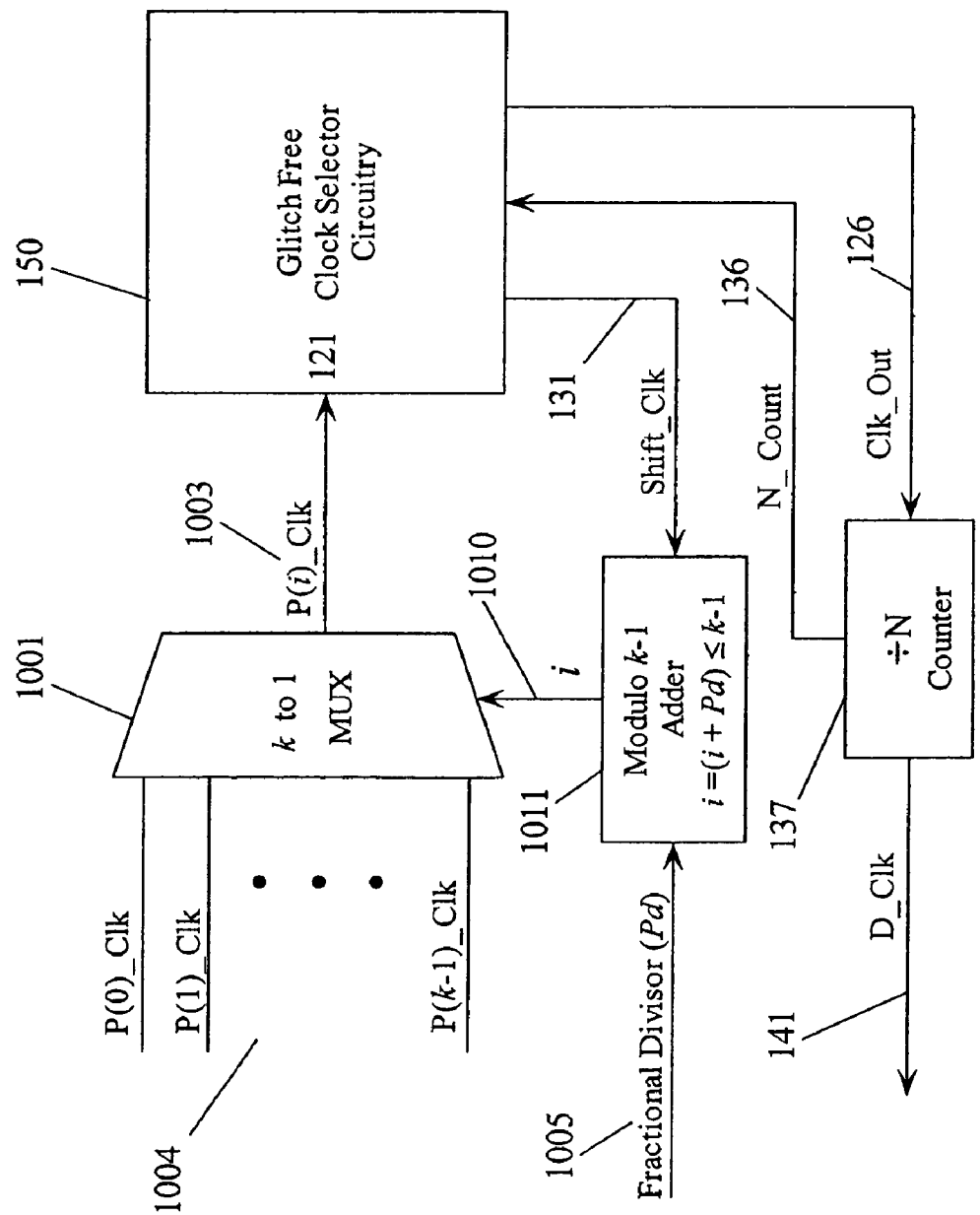
FIG. 10 is a block diagram of another embodiment of the invention.

FIG. 10 is a block diagram of another embodiment of the present invention. Glitch free circuitry 150 and divide by N counter 137 is used in conjunction with a k to 1 MUX 1001, modulo (k-1) adder circuitry 1011. Modulo (k-1) adder circuitry 1011 adds a fractional divisor value Pd 1005 to a present value of i 1010 to generate a new value for i 1010 in response to a transition in Shift_Clk signal 131 from circuitry 150. Counter 137 counts Clk_Out 126 and generates N_Count 136 when the Nth transition is counted. Clk_Out 126 clocks counter 137 so that the Nth cycle of Clk_Out 126 is extended by a fractional amount determined by which clock phase 1004 is selected as P(i)_Clk 1003 in response to the value of i 1010. Fractional divisor 1005 may be any integer value from zero to (k-1). Modulo (k-1) adder 1011 adds Pd 1005 to the present value of i 1010 and outputs a new value for i 1010 when Shift_Clk 131 transitions to a logic one (arbitrary implementation). This increments from the present P(i)_Clk 1003 to a new P(i)_Clk 1003 assuring the desired fractional extension of the Nth cycle of Clk_Out 126. Selector circuit 150 disables Clk_Out 126 when it is a logic zero and following the present P(i)_Clk 1003 and enables Clk_Out 126 when the new P(i)_Clk 1003 (i incremented by Pd) is a logic zero assuring a glitch free extension of the Nth cycle of Clk_Out 126. The value of i 1010 can only assume one of the possible values (0 to k−1) and its initial value does not matter. Pd 1005 may be changed at any time as it is synchronized by Shift_Clk 131 which only changes logic states following the Nth transition of Clk_Out 126 and then again at the Nth+1 transition of Clk_Out 126. D_Clk has a period that is equal to (N+Pd/(k))×T.

Figure 8:
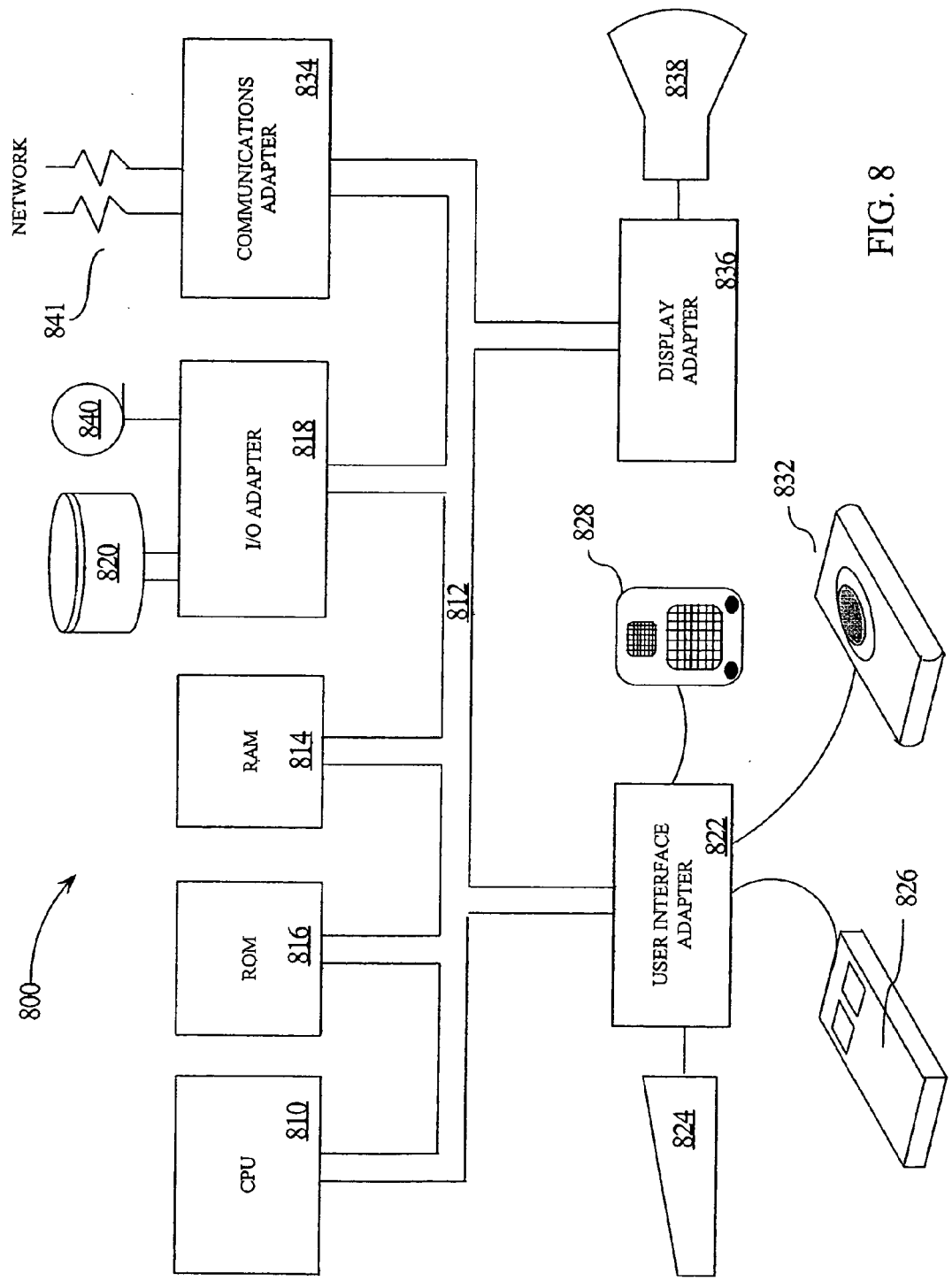
FIG. 8 is a data processing system with a central processor that may employ a fractional divided clock according to embodiments of the present invention.

FIG. 8 is a high level functional block diagram of a representative data processing system 800 suitable for practicing the principles of the present invention. Data processing system 800, includes a central processing system (CPU) 810 operating in conjunction with a system bus 812. System bus 812 operates in accordance with a standard bus protocol compatible with CPU 810. CPU 810 operates in conjunction with read-only memory (ROM) 816 and random access memory (RAM) 814. Among other things, EEPROM 816 supports storage of the Basic Input Output System (BIOS) data and recovery code. RAM 814 includes, DRAM (Dynamic Random Access Memory) system memory and SRAM (Static Random Access Memory) external cache. I/O Adapter 818 allows for an interconnection between the devices on system bus 812 and external peripherals, such as mass storage devices (e.g., a hard drive, floppy drive or CD/ROM drive), or a printer 840. A peripheral device 820 is, for example, coupled to a peripheral control interface (PCI) bus, and I/O adapter 818, therefore, may be a PCI bus bridge. User interface adapter 822 couples various user input devices, such as a keyboard 824, mouse 826, touch pad 832 or speaker 828 to the processing devices on bus 812. Display 839 which may be, for example, a cathode ray tube (CRT), liquid crystal display (LCD) or similar conventional display units. Display adapter 836 may include, among other things, a conventional display controller and frame buffer memory.

Data processing system 800 may be selectively coupled to a computer or telecommunications network 841 through communications adapter 834. Communications adapter 834 may include, for example, a modem for connection to a telecom network and/or hardware and software for connecting to a computer network such as a local area network (LAN) or a wide area network (WAN). CPU 810 and other components of data processing system 800 may contain a clock generation circuit that employs a PLL 700 with an FFD 100 according to embodiments of the present invention.

The present invention and its advantages have been described in detail, it should be understood that various changes, substitutions and alterations can be made herein without departing from the spirit and scope of the invention as defined by the appended claims.

What is claimed is:

1. A method of generating a non-integer frequency divided clock signal comprising the steps of:
    a) generating a number K of output signal phases P(0) to P(K−1);
    b) outputting a present value of an integer index in response to a logic transition of a shift clock signal;
    c) selecting one of the K output signal phases P(0) to P(K−1) corresponding to the present value of the integer index as a clock output signal using a glitch free clock selector circuit;
    d) clocking a synchronous divide by N counter with the clock output signal generating the non-integer frequency divided clock signal and the shift clock signal;
    e) determining when the synchronous divide by N counter has been clocked N times by the clock output signal, wherein the shift clock signal is generated by a transition of the clock output signal following an Nth transition of the clock output signal;
    f) receiving an integer fractional divisor having a value less than (K−1); and
    g) adding the value of the integer fractional divisor to the present value of the integer index in a modulo (K−1) adding circuit generating a new present value of the integer index.

2. The method of claim 1, wherein the non-integer frequency divided clock signal is used as a feedback clock signal of a phase locked loop circuit having a multiphase voltage controlled oscillator generating the K of equally phased output signals P(0) to P(K−1).

3. The method of claim 1, wherein the K output signal phases P(0) to P(K−1) each have a period T and are progressively phase shifted by an equal amount T/K.

4. A circuit for generating a non-integer frequency divided clock signal that is frequency divided from a clock output signal comprising:
    a multiple phase clock having a number K of output signal phases P(0) to P(K−1);
    circuitry for outputting a present value M of an integer index in response to a logic transition of a shift clock signal;
    glitch free clock selector circuitry for selecting one of the K output signal phases P(M) as a clock output signal in response to the present value M of the integer index;
    a synchronous divide by N counter clocked by the clock output signal thereby generating the frequency divided clock signal and the shift clock signal;
    circuitry in the divide by N counter for determining when the divide by N counter has been clocked N times by the clock output signal, wherein the shift clock signal is generated by a transition of the clock output signal on a transition following an Nth transition of the clock output signal;
    circuitry for receiving an integer fractional divisor having a value S having a value less than (K−1); and
    modulo (K−1) adding circuitry for adding the value S to a value of the integer index generating the present value M.

5. The circuit of claim 4, wherein the non-integer value is (N+S/K).

6. The circuit of claim 4, wherein the glitch free clock selector circuitry comprises a K to one Phase multiplexer (MUX) receiving the K clock phase signals and generating a Phase MUX output as P(M), a selected one of the K clock phase signals, in response to a K bit MUX select signal, wherein only one of the K bits is a logic one corresponding to the present value M of the integer index.

7. The circuit of claim 4, wherein the modulo (K−1) adding circuitry comprises:
    circuitry for converting S to a K bit phase select signal wherein one of the K bits is a logic one and K corresponds to the value S;
    a number of K (K to one) Select MUXs, wherein each input of the K Select MUXs is coupled to one of the K bits of the K bit MUX select signal and the ordering of the coupling for each of the K Select MUXs is rotationally shifted by one from an adjacent Select MUX; and
    a K bit register, wherein each register bit stores a state of the output of each of the K Select MUXs in response to the shift clock signal and the outputs of the K bit register form the K bit MUX select signal.

8. The circuit of claim 6, wherein the glitch free clock selector circuitry further comprises a logic circuit for generating the clock output signal as a logic combination of the Phase MUX output and a sequential gating signal that depends on a previous state of the clock output signal.

9. The circuit of claim 4, wherein the K output signal phases P(0) to P(K−1) each have a period T and are progressively phase shifted by an equal amount T/K.

10. A phase locked loop circuit for generating a phase clock signal with a frequency that is a non-integer multiple of a reference clock signal comprising:
    a multiphase voltage controlled oscillator (MVCO) generating the phase clock signal as one of a number K of output signal phases P(0) to P(K−1) and the frequency of the phase clock signal is controlled by a control voltage;
    a phase frequency detector for comparing a frequency divided clock signal to the reference clock signal and generating a phase/frequency error signal;
    circuitry for converting the phase/frequency error signal to the control voltage; and
    division circuitry for generating the frequency divided clock signal by frequency dividing a selected one P(M) of the K equally phased output signals by a non-integer value, wherein the division circuitry has circuitry for outputting a present value M of an integer index in response to a logic transition of a shift clock signal, glitch free clock selector circuitry for selecting one of the K equally phased output signals P(M) as a clock output signal in response to the present value M of the integer index, a synchronous divide by N counter clocked by the clock output signal thereby generating the frequency divided clock signal and the shift clock signal, circuitry in the divide by N counter for determining when the divide by N counter has been clocked N times by the clock output signal, wherein the shift clock signal is generated by a transition of the clock output signal on a transition following an Nth transition of the clock output signal, circuitry for receiving an integer fractional divisor having a value S having a value less than (K−1), and modulo (K−1) adding circuitry for adding the value S to a value of the integer index generating the present value M.

11. The phase locked loop circuit of claim 10, wherein the non-integer multiple has a value (N+S/K).

12. The phase locked loop circuit of claim 10, wherein the glitch free clock selector circuitry comprises a K to one Phase multiplexer (MUX) receiving the K clock phase signals and generating a Phase MUX output as P(M), a selected one of the K clock phase signals, in response to a K bit MUX select signal, wherein only one of the K bits is a logic one corresponding to the present value M of the integer index.

13. The phase locked loop circuit of claim 10, wherein the modulo (K−1) adding circuitry comprises:
   circuitry for converting S to a K bit phase select signal wherein one of the K bits is a logic one and K corresponds to the value S;
   a number of K (K to one) Select MUXs, wherein each input of the K Select MUXs is coupled to one of the K bits of the K bit MUX select signal and the ordering of the coupling for each of the K Select MUXs is rotationally shifted by one from an adjacent Select MUX; and
   a K bit register, wherein each register bit stores a state of the output of each of the K Select MUXs in response to the shift clock signal and the outputs of the K bit register form the K bit MUX select signal.

14. The phase locked loop circuit of claim 12, wherein the glitch free clock selector circuitry further comprises a logic circuit for generating the clock output signal as a logic combination of the Phase MUX output and a sequential gating signal that depends on a previous state of the clock output signal.

15. The phase locked loop circuit of claim 10, wherein the K output signal phases P(0) to P(K−1) each have a period T and are progressively phase shifted by an equal amount T/K.

16. A data processing system comprising:
   a central processing unit (CPU) clocked by a CPU clock signal;
   a random access memory (RAM);
   a read only memory (ROM);
   an I/O adapter;
   a bus system coupling said CPU to said ROM, said communications adapter, said I/O adapter, and said RAM, wherein the CPU clock signal is generated by phase locked loop circuitry as a non-integer multiple of a reference clock signal, the phase locked loop circuitry having a multiphase voltage controlled oscillator (MVCO) generating the CPU clock signal as one of a number K of output signal phases P(0) to P(K−1) and the frequency of the CPU clock signal is controlled by a control voltage;
   a phase frequency detector for comparing a frequency divided clock signal to the reference clock signal and generating a phase/frequency error signal;
   circuitry for converting the phase/frequency error signal to the control voltage; and
   division circuitry for generating the frequency divided clock signal by frequency dividing a selected one P(M) of the K equally phased output signals by a non-integer value, wherein the division circuitry has circuitry for outputting a present value M of an integer index in response to a logic transition of a shift clock signal, glitch free clock selector circuitry for selecting one of the K equally phased output signals P(M) as a clock output signal in response to the present value M of the integer index, a synchronous divide by N counter clocked by the clock output signal thereby generating the frequency divided clock signal and the shift clock signal, circuitry in the divide by N counter for determining when the divide by N counter has been clocked N times by the clock output signal, wherein the shift clock signal is generated by a transition of the clock output signal on a transition following an Nth transition of the clock output signal, circuitry for receiving an integer fractional divisor having a value S having a value less than (K−1), and modulo (K−1) adding circuitry for adding the value S to a value of the integer index generating the present value M.

17. The data processing system of claim 16, wherein the glitch free clock selector circuitry comprises a K to one Phase multiplexer (MUX) receiving the K clock phase signals and generating a Phase MUX output as P(M), a selected one of the K clock phase signals, in response to a K bit MUX select signal, wherein only one of the K bits is a logic one corresponding to the present value M of the integer index.

18. The data processing system of claim 16, wherein the modulo (K−1) adding circuitry comprises:
   circuitry for converting S to a K bit phase select signal wherein one of the K bits is a logic one and K corresponds to the value S;
   a number of K (K to one) Select MUXs, wherein each input of the K Select MUXs is coupled to one of the K bits of the K bit MUX select signal and the ordering of the coupling for each of the K Select MUXs is rotationally shifted by one from an adjacent Select MUX; and
   a K bit register, wherein each register bit stores a state of the output of each of the K Select MUXs in response to the shift clock signal and the outputs of the K bit register form the K bit MUX select signal.

19. The data processing system of claim 17, wherein the glitch free clock selector circuitry further comprises a logic circuit for generating the clock output signal as a logic combination of the Phase MUX output and a sequential gating signal that depends on a previous state of the clock output signal.

20. The data processing system of claim 16, wherein the K output signal phases P(0) to P(K−1) each have a period T and are progressively phase shifted by an equal amount T/K.

* * * * *